Figure 1:
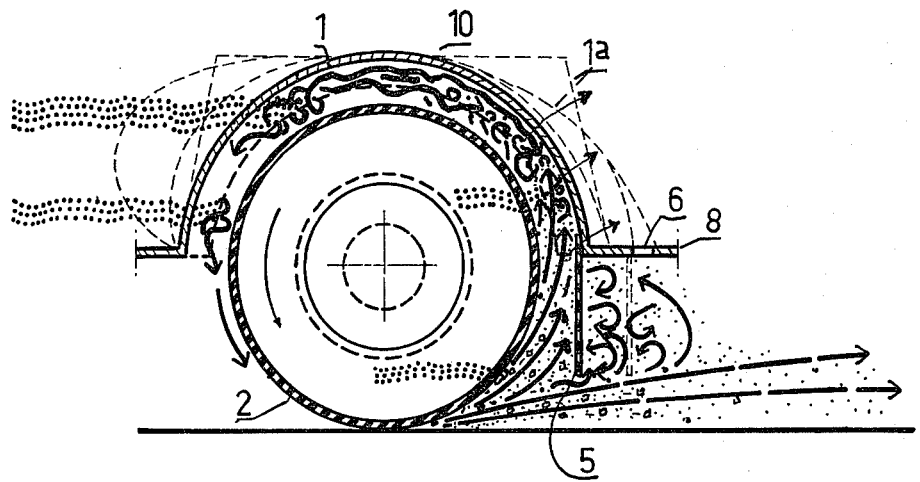

United States Patent [19]

Iwanicki

[11] 4,334,694
[45] Jun. 15, 1982

[54] SPLASH PROTECTION ASSEMBLY FOR VEHICLES EQUIPPED WITH MUDGUARDS

[76] Inventor: Andrzej T. Iwanicki, Östrandsvägen 72, S-122 43 Enskede, Sweden

[21] Appl. No.: 23,192

[22] PCT Filed: Jul. 11, 1978

[86] PCT No.: PCT/SE78/00016
§ 371 Date: Mar. 12, 1979
§ 102(e) Date: Mar. 12, 1979

[87] PCT Pub. No.: WO79/00039
PCT Pub. Date: Feb. 8, 1979

[30] Foreign Application Priority Data

Jul. 11, 1977 [SE] Sweden .............................. 7778063

[51] Int. Cl.³ ............................................. B62D 25/18
[52] U.S. Cl. ........................ 280/154.5 R; 280/153 R; 280/158 R
[58] Field of Search ............... 280/154.5 R, 154.5 A, 280/152 R, 152 A, 152 B, 153 R, 153 A, 153 B, 158 R

[56] References Cited

U.S. PATENT DOCUMENTS 1,220,494  3/1917  Butler .................... 280/158

FOREIGN PATENT DOCUMENTS

| 191703 | 10/1907 | Fed. Rep. of Germany | 280/159 |
| 227760 | 10/1910 | Fed. Rep. of Germany | 280/159 |
| 2025519 | 12/1971 | Fed. Rep. of Germany | 280/154.5 R |
| 1055386 | 10/1953 | France | 280/154.5 R |
| 84539 | 3/1920 | Switzerland | 280/159 |
| 155961 | 9/1932 | Switzerland | 280/154.5 A |
| 8689 | of 1903 | United Kingdom | 280/158 R |
| 20020 | of 1912 | United Kingdom | 280/153 R |
| 1058892 | 2/1967 | United Kingdom | 280/154.5 R |

Primary Examiner—Joseph F. Peters, Jr.
Assistant Examiner—Milton L. Smith
Attorney, Agent, or Firm—Oblon, Fisher, Spivak, McClelland & Maier

[57] ABSTRACT

An assembly intended to eliminate the turbulence and pressure rise occurring inside a mudguard (1) due to the effect of the airflow, caused by the motion of the vehicle, passing over the inside of the mudguard and meeting the counter-directed airstream caused by rotation of the wheel (2) and the splash formed thereby. By introducing guide means (3,4) between wheel (2) and mudguard (1), these streams of air can be mutually separated and the wheel airstream redirected to coincide with the airflow on the inside of the mudguard without pressure rises and consequent turbulence occurring inside the mudguard. The assembly can have one or more vanes (4) or a body (3) forming a portion of a channel (9a,9) for the airflow along the inside of the mudguard and simultaneously redirecting a portion of the wheel airstream.

15 Claims, 49 Drawing Figures

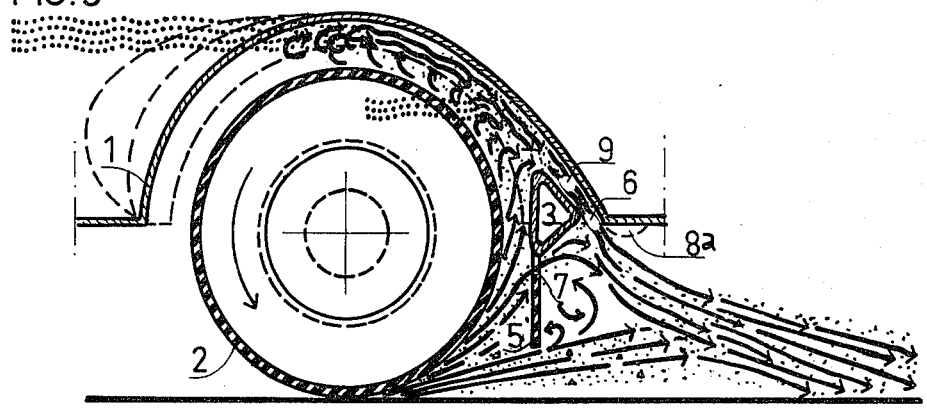
FIG. 3
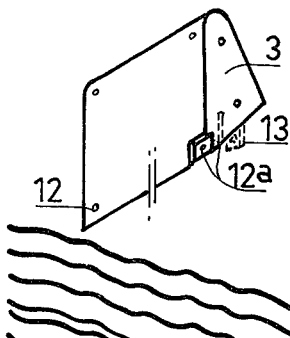
FIG. 5
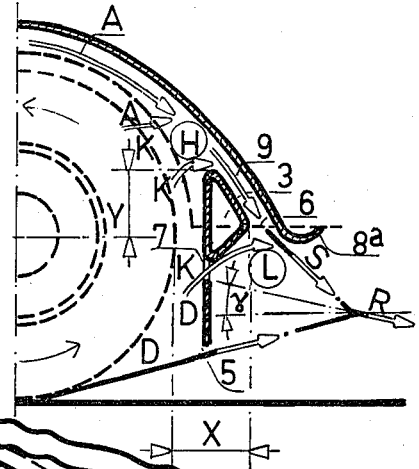
FIG. 4
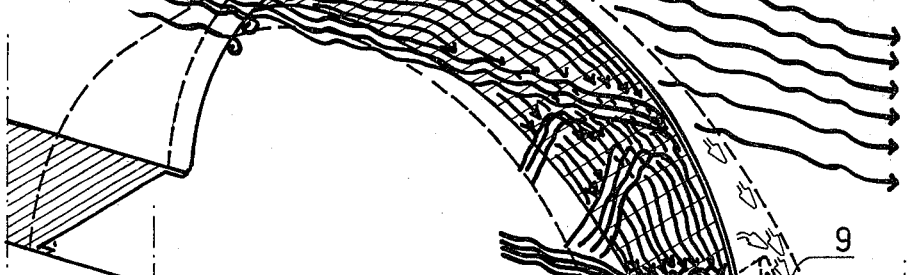
FIG. 6
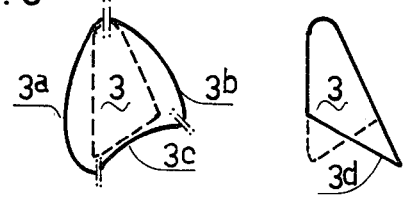
FIG. 8    FIG. 7
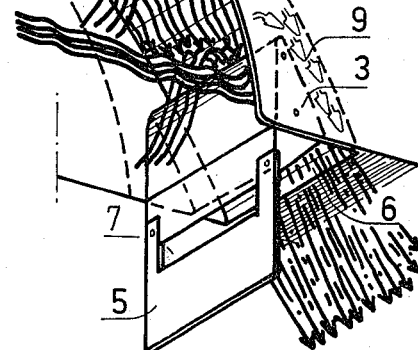

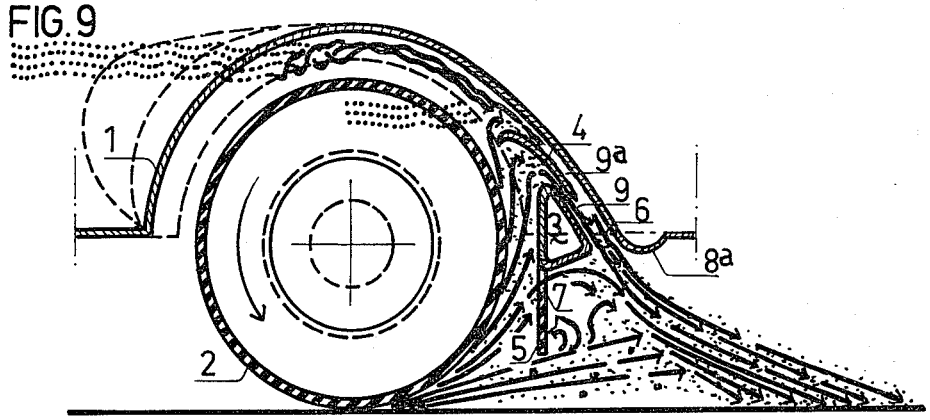
FIG. 9
FIG. 11
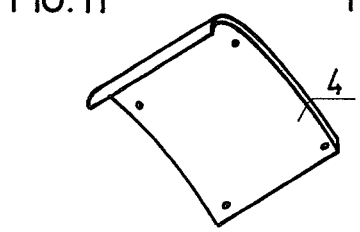
FIG. 10
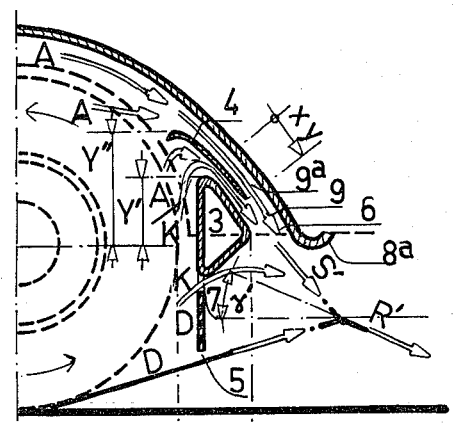
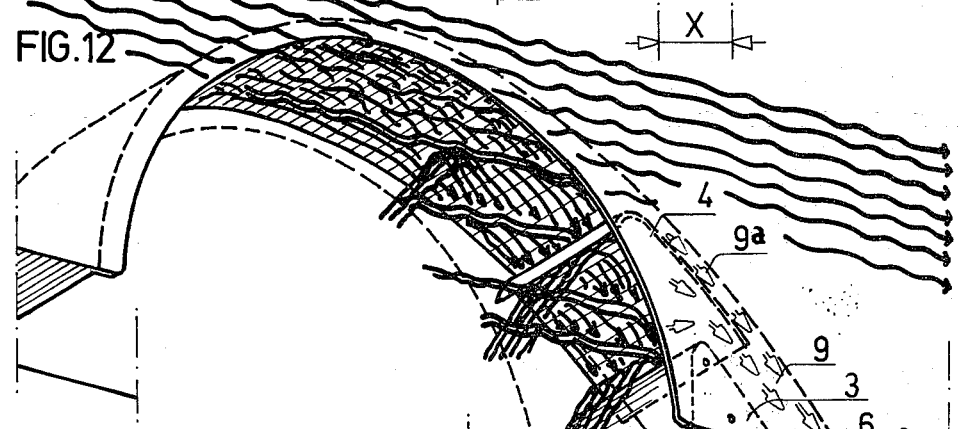
FIG. 12
FIG. 13
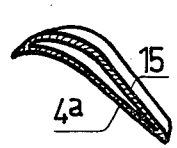
FIG. 14
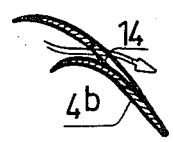
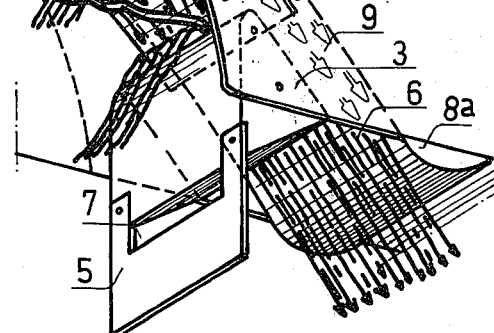

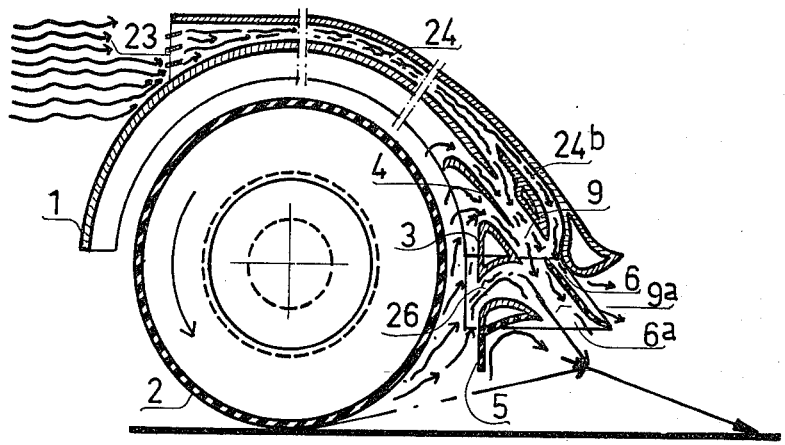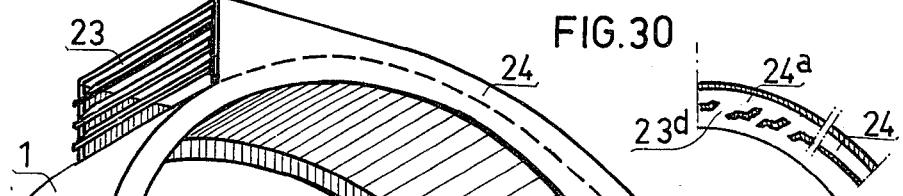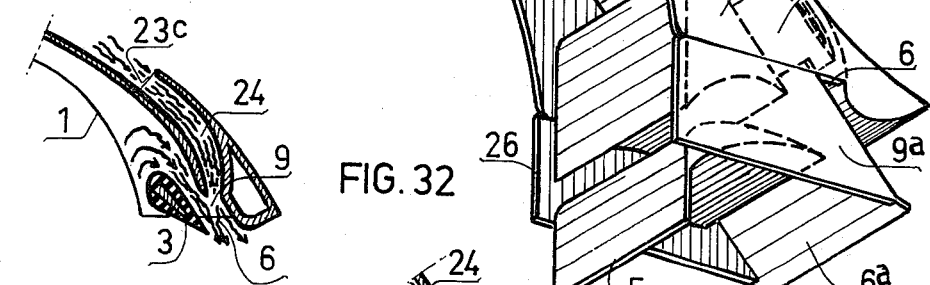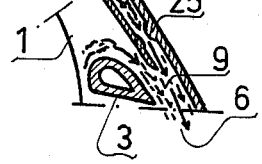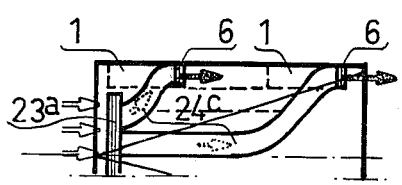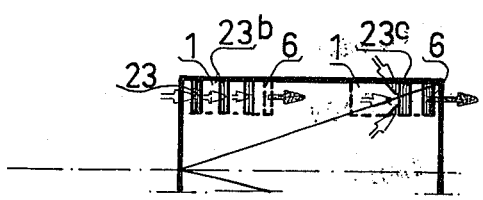

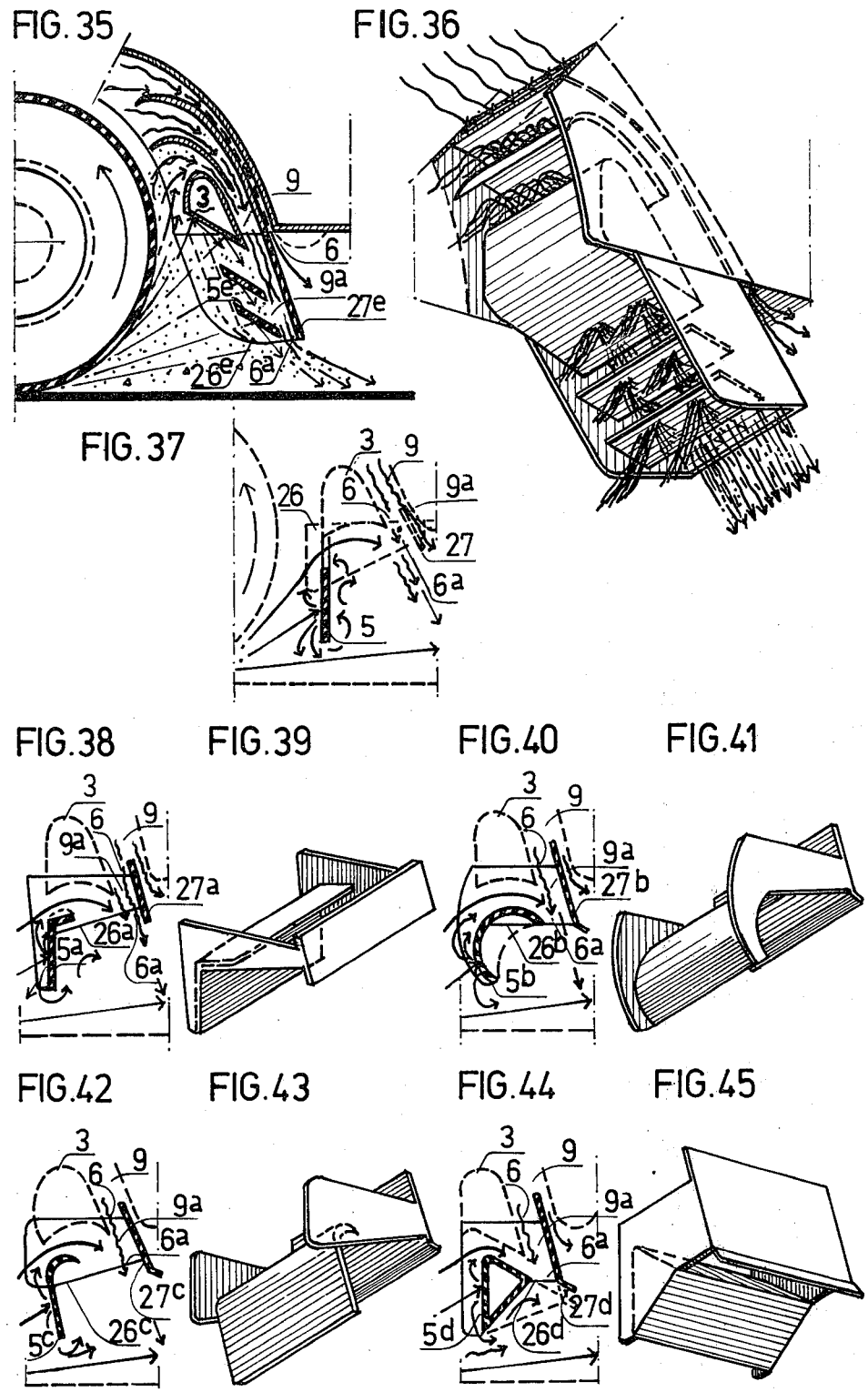

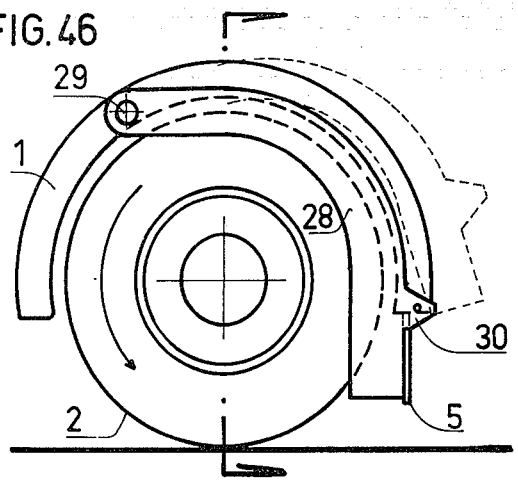
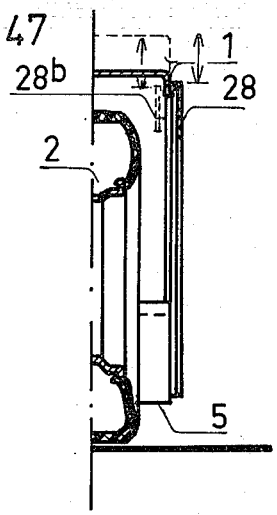
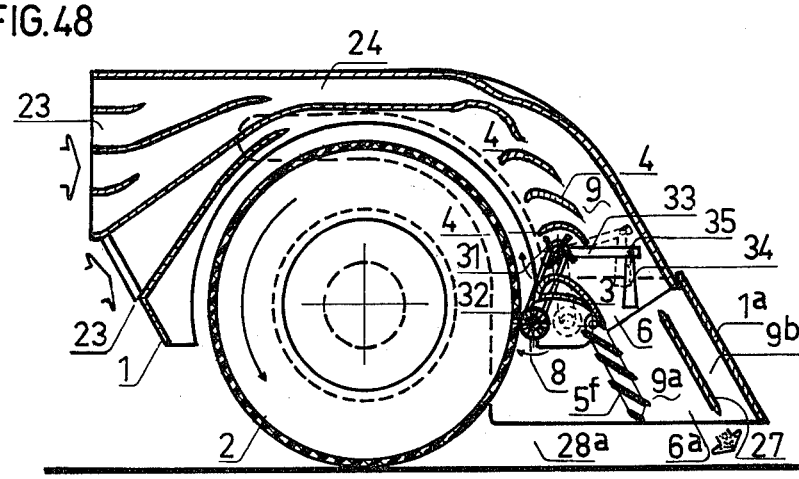
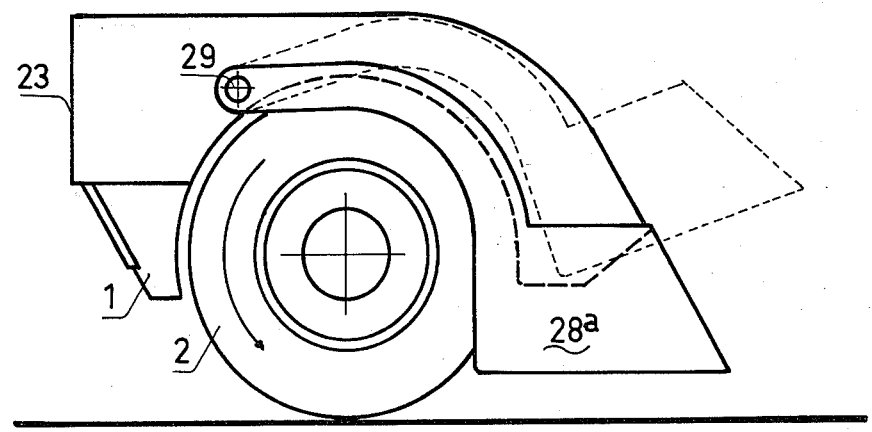

SPLASH PROTECTION ASSEMBLY FOR VEHICLES EQUIPPED WITH MUDGUARDS

The present invention relates to a splash protection assembly for vehicles equipped with mudguards comprising means arranged between the wheel of the vehicle and the mudguard to lessen the spread of dust and splash resulting from the movement of the vehicle.

There are a number of different kinds of splash protectors in the prior art, as is apparent from the following publications:

Swedish Pat. Nos. 320 281, 324 113 and 212 544 as well as Swedish Pat. No. 798/72, U.S. Pat. Nos. 2,619,363, 2,782,053, 3,198,545 and 3,341,222, German Pat. No. 880 555 and German Application Nos. 2 025 519 and 2 045 212.

In the great majority of these known splash protection assemblies, the accepted theory is that the water and dust mist occurring behind a vehicle in movement can be eliminated by preventing splashes from impinging on different parts of the inside of the mudguard and mud-flap where they are disintegrated into smaller drops forming the mist at the side and behind the vehicle. The term "splash" is intended here to denote the portion of the splash which is generated by water and particles being entrained in the tire tread and tangentially flung off by centrifugal force from the tire.

Heavier particles will thus be thrown off from the tire relatively quickly, while water and smaller particles are thrown off at a later time, due to the suction effect occurring when the tire tread expands after contact with the road surface. This time is dependent on the size of the mud particle, adhesion force between the tire and the particle and the circumferential speed of the wheel. With low circumferential speed, the adhesion force dominates, and the majority of the muddy water is retained in the tire for the greater part of the rotation. With a higher circumferential speed, the adhesion force is overcome by the centrifugal force and there is a separation of particles in the direction of rotation of the tire, the heavier particles being separated first while lighter particles are separated later, at times depending on the weight of the particle, the adhesion force and the centrifugal force.

The screening assemblies of the prior art are formed in such way that mainly heavier particles are prevented from being thrown off towards a following vehicle. This effect is also obtained by different kinds of so-called "mudflaps", i.e. the splash protectors of flexible material which are usually fixed to the extension of the mudguard behind the tire and towards the road surface. In certain structures the screen has been placed as close to the circumference of the wheel as possible, and has been directed so that the particles thrown off in front of the screen impinge on it and are partially guided back down towards the road surface in a spread-out condition. The particles of muddy water which are thrown off behind the screen will thus, as previously, give rise to a mist of water around the vehicle. This function is also strived for in newer types of mudflap, and it therefore consists of a plurality of baffles which guide the heavier particles in the splash down towards the road surface. All these known structures are, however, only intended to limit the spread of the heavier particles in the splash and not the part which is thrown off later, and which gives rise to the water mist behind and at the side of the vehicle.

Only in one of the patent specifications cited above, namely the German patent specification No. 880 555, is there indicated an arrangement in the form of a splash plate for motor vehicles, especially motorcycles, intended to service as an impinging surface for the part of the splash normally impinging on the inside of the mudguard, said splash being caused to flow against the direction of vehicle travel by reason of its speed, and out from the forward and upper portion of the mudguard, where the drops are then redirected by the airflow and thrown to the sides so that they impinge on the legs of the driver ("airflow" being defined in this context as the relative stream of air due to travel). To prevent this effect, a guiding screen is placed, according to the German specification, between the wheel and the inside of the mudguard, this screen being intended to form an impinging surface for a part of the splash, which is then caught up by the screen and is forced by the airflow back into the mudguard instead of being sprayed out in front of it. This structure does not prevent particles of water from flowing out from the mudguard at the sides, as a result of the phenomena observed in conjunction with the present invention.

None of the structures in the prior art has been found particularly effective for preventing the occurrence of splash wake in spite of theoretical as well as practical attempts to solve the problem. The occurrence of splash wake naturally has large drawbacks, and contributes to a great extent to deteriorated traffic safety in conjunction with snow or rainfall, or very dusty roads.

The present invention is based on new knowledge of the complex aerodynamics and other conditions giving rise to splash wake, and by utilizing this knowledge there is proposed, according to the present invention, a splash protection assembly, in which there is positioned between the wheel and the mudguard at least one guide member with its surface facing towards the mudguard, which together with the inside of the mudguard or with a further guide member is intended to form at least a part of a channel between (1) a zone with increased air pressure, occurring substantially through the action of the airflow between the wheel and the mudguard and a stream of air substantially counter thereto, occurring as the result of the rotation of the wheel and the thus formed splash, and (2), another zone with lower air pressure situated downstream, in the airflow direction, of the zone having increased air pressure.

In accordance with an embodiment of the assembly, the guide member is formed with at least two guide surfaces, one of which is facing towards the mudguard and constitutes a part of the channel between both the pressure zones, while the other is facing towards the wheel, and constitutes a guiding surface for a portion of the airstream developed by the rotation of the wheel and the splash wake.

Figure 2:
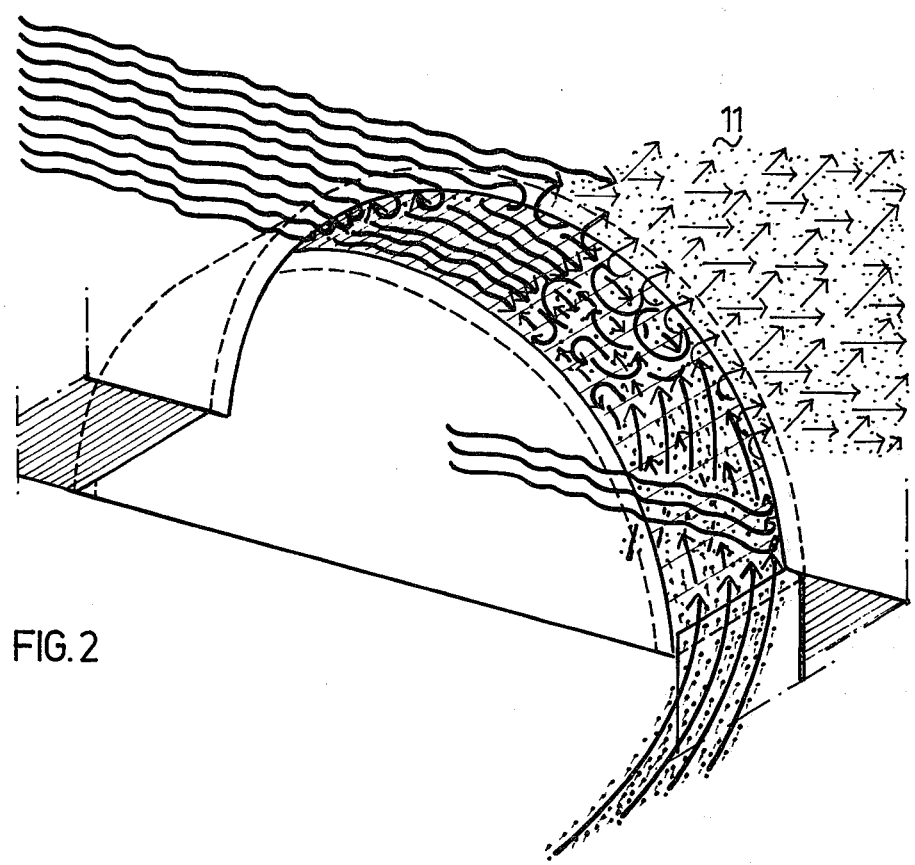
Figure 15:
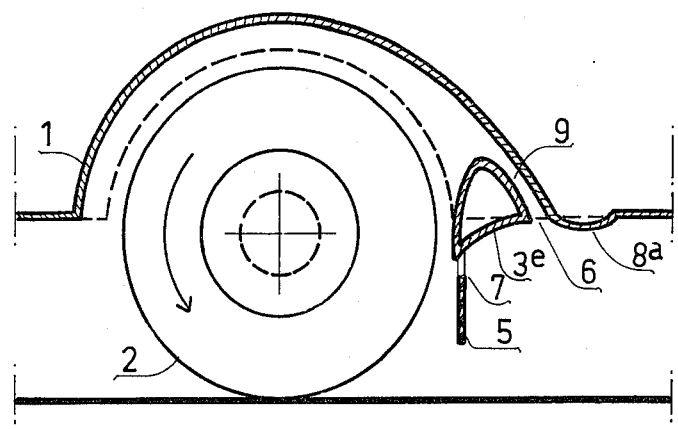
Figure 16:
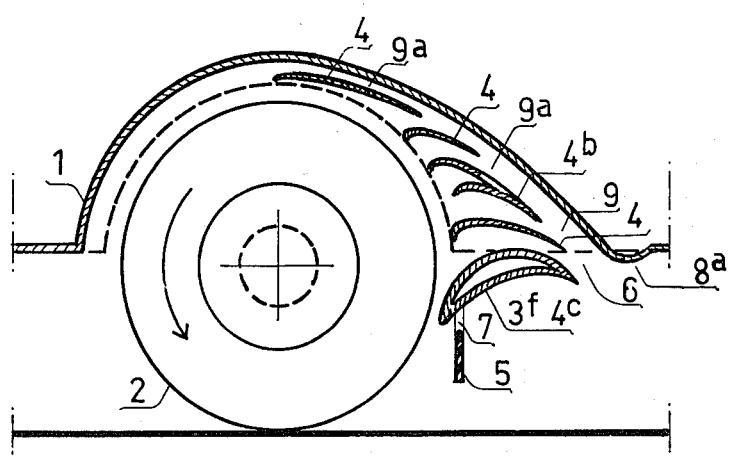
Figure 17:
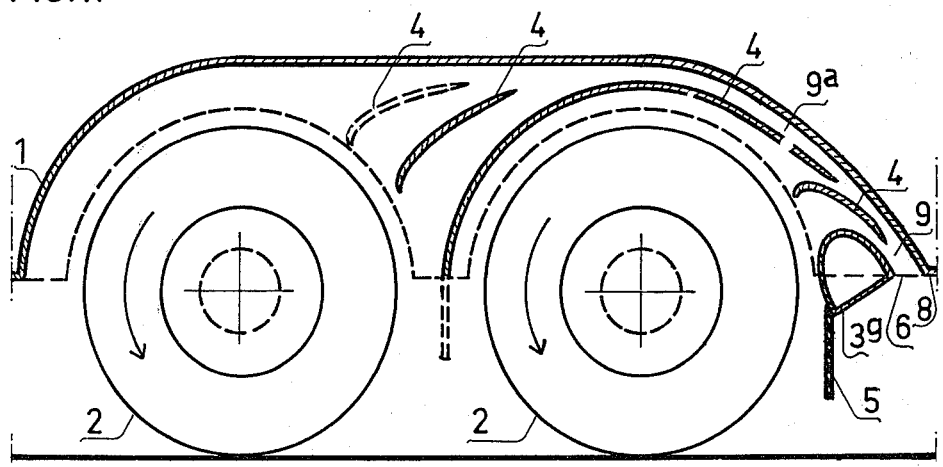
Figure 18:
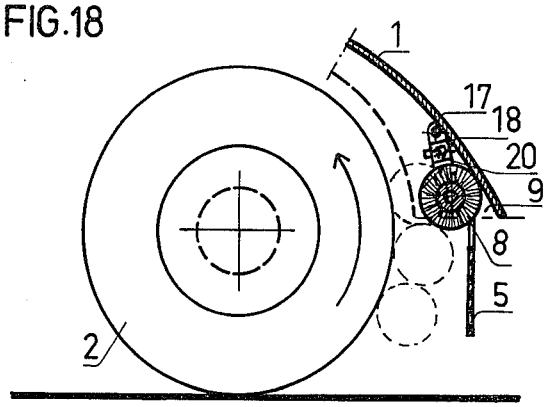
Figure 19:
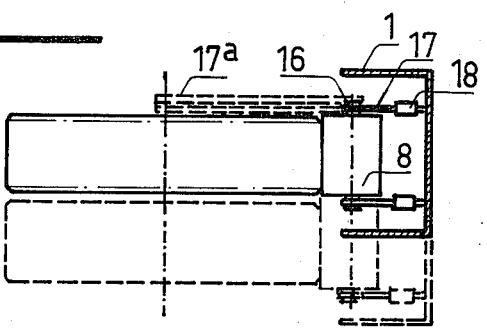
Figure 20:
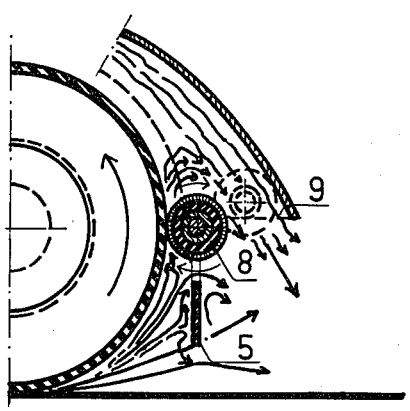
Figure 21:
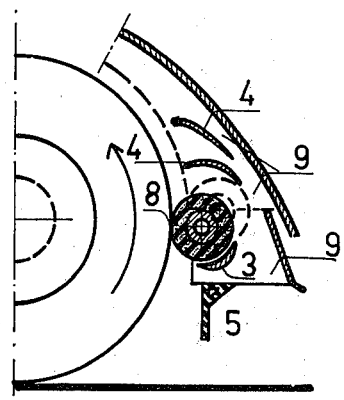
Figure 22:
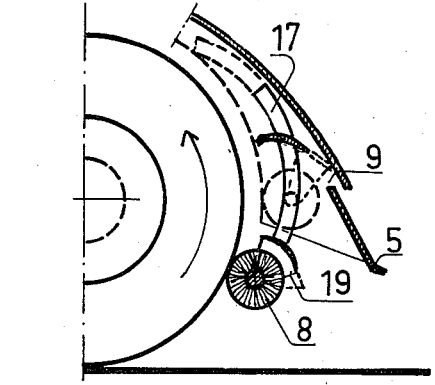
Figure 23:
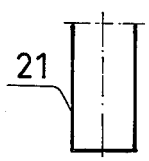
Figure 24:
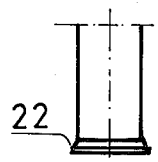

Some embodiments of the invention selected as examples are described below while referring to the accompanying drawings, on which FIG. 1 is a schematic sideview of a vehicle wheel with a conventional mudguard and mudflap, with the air currents and splash occurring in this mudguard in a first phase of the splash spread, FIG. 2 is a side perspective view of the air currents and splash under the mudguard and during a later phase of the splash spread than is shown in FIG. 1, FIG. 3 is the same sideview as in FIG. 1, although here there is introduced a guide member in the form of a guide body according to the invention, FIG. 4 is a function diagram of the assembly according to FIG. 3, together with the currents and pressure zones occurring inside the mudguard, FIG. 5 is a perspective view of the guide body according to FIGS. 3 and 4, FIG. 6 is the same view as in FIG. 2 but with a guide body in place and with the thus-altered air currents and splash, FIGS. 7 and 8 show alternative forms of the guide body according to FIG. 5, FIG. 9 is the same sideview as in FIG. 3, now supplemented with a further guide member in the form of a baffle plate, FIG. 10 is a function diagram of the assembly in FIG. 9, FIG. 11 is a perspective view of the baffle plate introduced in FIGS. 9 and 10, FIG. 12 is the same view of the mudguard as in FIG. 6, supplemented by a baffle plate according to the invention and with the air currents and splash prevailing in this alternative embodiment, FIGS. 13 and 14 show alternative embodiments of baffle plates, FIGS. 15 and 16 show alternative embodiments of both guide body and baffle plates, FIG. 17 illustrates the application of the invention to a vehicle with pairs of wheels in tandem, FIG. 18 shows an embodiment having a guide element in the form of a cylindrical body, FIG. 19 shows the assembly in FIG. 18 seen from above, FIG. 20 shows the function of the cylindrical guide body in FIG. 18, FIG. 21 shows a combination of baffle plates and a cylindrical guide body, FIG. 22 shows a further alternative embodiment in which the cylindrical guide body has been supplemented with baffle plates, FIGS. 23-27 are views from one side and above of different embodiments of the cylindrical guide body, FIG. 28 is a schematic sideview of a further embodiment in which the mudguard has been formed with an outer channel and an outer air intake, and the mudflap has been provided with guiding means, FIG. 29 is a detailed perspective view of the embodiment in FIG. 28, FIG. 30 is a detail of an embodiment where the mudguard has been provided with through-passages between the outer and inner channels, FIG. 31 is a cross-section of an alternative embodiment of the outer channel with the air intake placed at the rear portion of the mudguard, FIG. 32 is a cross-section of a detail of the outer channel, FIG. 33 is a schematic view of the mudguard seen from above with individual air intakes to the outer channel, FIG. 34 is the same view as in FIG. 33 but of an alternative embodiment with a central air intake and individual channels leading the air to the inner channel, FIG. 35 is a schematic sideview of a still further embodiment in accordance with the invention, in which the mudflap consists of obliquely directed fins, forming a portion of the inner channel together with an extended baffle, FIG. 36 is a perspective view of the splash protection assembly in FIG. 35, FIGS. 37 and 38 are schematic cross-sections of the air currents for a guiding body with two alternative embodiments of a mudflap, FIG. 39 is a perspective view of the mudflap in FIG. 38, FIGS. 40, 42 and 44 are schematic cross-sections of the air currents for three different embodiments of guide body and mudflap, FIGS. 41, 43 and 45 are perspective views of the mudflaps in FIGS. 40, 42 and 44, respectively, FIG. 46 is a sideview of an embodiment which is provided with movable side pieces mounted pivotably on the mudguard, FIG. 47 is a section of the assembly shown in FIG. 46, FIG. 48 is a schematic sideview of an embodiment containing a complete general arrangement of the different splash protection means shown in the previous Figures and furthermore provided with a fan driven by a cylindrical guide body, FIG. 49 is a sideview of the exterior of the embodiment in FIG. 48, where the motion of the side parts is indicated by dashed lines.

As is apparent from FIG. 1, there is a heavily turbulent zone 10 between the mudguard and the vehicle wheel as a result of the airflow being opposed in direction to the airstream generated by the splash and rotation of the wheel, thus giving rise to zone 10 at increased pressure, from which air eddies out at the sides towards zones with lower pressure as is indicated in FIG. 2 by the numeral 11. The zones with lower pressure occur, for reasons including the airflow generating a certain suction effect, the air mixed with dust or particles of water and flowing out from the mudguard being spread sideways and behind the vehicle under the action of passing air. As is also apparent from FIG. 1, a mudflap 5 is placed conventionally at the rear edge of the mudguard to prevent larger particles from being thrown directly towards a following vehicle. A conventional mudguard with a mudflap of this kind reinforces the spreading effect of dust and water particles, however, since a turbulent zone is formed behind the mudflap. Conventional mudguards have also a certain aerodynamic braking effect on the vehicle and attempts are generally made to reduce this effect by placing the mudguard closer to the wheel. This measure also contributes to reinforcing the spread of water and dirt mist around the vehicle. The turbulent excess pressure zone 10 moves counter to the direction of rotation of the wheel as the circumferential speed of the wheel increases, which has to do with the centrifugal force increasing with increasing circumferential speed, while the adhesion force is substantially constant and independent of the speed, as has already been pointed out in the general portion of this description. With a conventional mudguard, the dynamic pressure of both the opposing streams of air is converted to a static excess pressure zone from which the air eddies out in the only direction where the air has a lower pressure, i.e. the edge portions of the mudguard, and the sub-pressure at these portions is reinforced by the airflow rushing past, as previously indicated.

The invention is based on the desire to prevent the occurrence of the static excess pressure zone formed with a conventional mudguard, and which can occur by not closing in the opposing streams of air between the mudguard and the wheel the prevention can be accomplished by separating them with the help of a guide member 3, with its side facing towards the mudguard, together with the inside of the mudguard or with a further guide member, forming a channel 9 between the zone at increased air pressure H and a zone L, with lower air pressure, situated downstream of the excess pressure zone H in the airflow direction. A natural expansion path is hereby achieved for the air between both pressure zones simultaneously as the dynamic pressure of the airflow is utilized to deflect the opposing airstream polluted with splash, and coming from the wheel, to force it back again towards the road surface in a collected stream of air which can be prevented by different means from spreading to any notable extent. FIGS. 3, 4 and 6 show how the air currents interact when a guide body 3 has been introduced between the wheel and mudguard, and how effectively this body separates the opposing air currents. When the air currents are mixed, the speed of the airstream generated by the splash has been substantially reduced while the airflow has a substantially greater dynamic pressure, resulting in that the first mentioned airstream is entrained, and is forced into the channel 9 and down towards the road surface. The suction effect can be improved by having a gap 7 between the mudflap 5 and the guide body 3, which can be given a configuration varying in different ways to increase the effect of the assembly.

It is indicated in FIG. 4 that the excess pressure zone H occurs firstly by the action of aerodynamic factors A, secondly by the kinetic factors K and thirdly by the mixture of these factors A and K. To further improve the flow from the channel 9, the bottom edge 8a of the mudguard can be given a configuration such that the exit flow vector S meets with a specific concentration and force the airflow vector D which varies directly as the circumferential speed of the wheel. These vectors should meet each other at an angle which is less than 90° and subsequently continue in a resulting direction R with an angle $\gamma$ to the road surface which will be proportional to the size of both vectors S and D. The effectiveness of the guide body 3 is dependent on its proportions along the x-axis as well as the y-axis, where "y-axis" relates to the distance of the body above the rotational axis of the wheels, and this distance should be so adjusted that the upwardly directed air currents K will be sufficiently weakened for deflection towards the inlet of the channel 9. The dimensioning of the guide body 3 along the y-axis can also vary, depending on what other elements are used together with the guide body in the splash protection assembly. A baffle 4 can be used, e.g. as is apparent from FIG. 10, so that the opposing airstreams A and AK are thus even more effectively separated to prevent the occurrence of a static excess pressure zone. The extension of the guide body along the horizontal line going through the wheel axis, is its extension along the x-axis, which increases the distance from the circumference of the wheel to the outlet of the channel 9 at the same time. The extension of the guide body along the x-axis should be adjusted so that passing currents, and especially the lower current passing through the gap 7, will be substantially free from turbulence. This effect can also be obtained by adjusting the form of the mudflap 5 as shown in FIGS. 40–45.

According to FIGS. 7 and 8, the guide body can be given different configurations to improve its coaction with the other members included in the assembly. For example, its surface 3a facing towards the wheel can be given a curved form, as is apparent from FIG. 8, so that the upward airstream K is partly separated more effectively from the airstream D caused by larger particles, and partly deflected more gently for connecting to the main airstream through the channel 9. From the other surfaces 3b and 3c it can be seen how the desired effect of preventing turbulence can be obtained at the same time as the different air currents passing over the surfaces of the guide body are effectively mixed. All these measures provide vectors which coact for providing a flow vector S, well-defined as to its magnitude and direction, which are also the deciding factors for how effectively dust and dirty water are caused to flow towards the road surface. FIG. 7 illustrates how the surface 3d of the guide body 3 can be varied partly to force the airstream KD towards the road surface, and partly for apportioning the air currents along both these adjacent side surfaces.

As indicated above, a baffle 4 can be introduced to further improve separation between the two opposing airstreams AK and A to reduce the risk of static pressure increase when both air currents are mixed. The flow rate is furthermore increased in the channel parts 9a and 9, which in turn improves the ejector effect for the airstreams AK and K, when these are caused to enter substantially parallel to the main airstream A in the channel 9. Such an arrangement results in the vector S' in FIG. 4 becoming greater than the vector S in turn signifying a more efficient damping effect on the vector D, since the angle $\gamma'$ of the resultant vector R' to the road surface will be greater than the angle $\gamma$ in FIG. 4. The configuration of the baffle can be varied, as is apparent from FIGS. 13 and 14, particularly the curve of its front edge and its radius, depending on its location between the mudguard and wheel.

The amount the leading edge of the baffle is bent downwards is denoted by the dimension z in FIG. 10, and the leading edge should be placed at a height of y" from the rotational axis of the wheel, which corresponds to the lower activating zone of the airstreams A. The length of the baffle 4 can also be varied, depending on the shape and size of the mudguard; the portion coinciding with the direction xy should then be adjusted to the dimensions of the channel 9 so that the channel functions as effectively as possible. In FIGS. 13 and 14 it is indicated how the configuration of the baffle can be varied and how the course of the flow can be controlled by introducing a plurality of baffles with different configurations and different locations.

FIGS. 15, 16 and 17 show how the guide body and baffle can be given different configurations for providing airstreams suited to the exterior conditions. FIG. 16 shows how the baffle can be formed with different configurations on both its defining surfaces, so that it can replace the guide body in certain cases. FIG. 17 shows an application of the baffle and guide body to tandem double wheels.

Figure 25:
Figure 26:
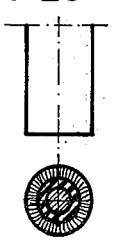
Figure 27:

In the embodiments of the splash protection assembly according to the invention shown on FIGS. 18–27 the guide body 8 is formed cylindrically and mounted on a shaft 16 carried by two arms 17, in turn pivotably mounted on the mudguard 1. The cylindrical body 8 can thus be brought into engagement with the vehicle wheel 2, e.g. by the arms 17 being actuated by a setting means 20, which can be either manually or automatically actuated. When the cylindrical guide body 8 is engaged against the wheel 2, it acts directly as a screen for the upwardly directed airflows denoted by the flow vectors K and AK in FIGS. 4 and 10. The cylindrical body is driven by the vehicle wheel, utilizing friction, at substantially the same circumferential speed as the wheel, and as a result of the centrifugal force it will redirect the trajectory of a portion of the particles loosened from the wheel, i.a. because of the frictional engagement. Furthermore, the contact between the cylindrical body and the wheel will, per se, loosen particles from the wheel and throw them in a direction influenced by the structure of the circumference of the body. As shown in FIGS. 25–27, this surface can either be smooth or patterned in combination with a short-bristled brush-like covering, as indicated in FIG. 26, or with long bristles as indicated in FIG. 27. The particles loosened and thrown off by the body will be given a trajectory joining the main flow A through the channel 9 between the body and the mudguard 1. The body can be arranged together with one or more baffles 19, which facilitates and improves the redirection of the airstream and the particles loosened from the vehicle wheel, while the assembly can also be combined with stationary baffles 4, previously described. The arrangement with a cylindrical guide body can be suitably combined with a mudflap 5, of the kind described earlier, with a gap 7 between the body and the mudflap for the particles thrown off from the vehicle wheel. Since the rotation of the body counteracts these airstreams, a limiting baffle can be introduced between these flow directions to eliminate static pressure zones with the undesired consequences these have. From FIG. 22 it is also apparent that both arms 17 carrying the cylindrical body 8 can be displaced in grooves to enable the body to be movably mounted.

According to an embodiment shown in FIGS. 28–34, outside airstreams can be utilized to increase the flow speed in the channel 9 between both pressure zones. These outside airstreams can be generated for example by an outer screen located outside the mudguard, the former together with the mudguard 1 forming an outer channel with air intake 23 and one or more outlets 24a and 24b. By means of this arrangement an auxiliary airstream is generated in the outer channel, and this airstream is introduced parallel to the main airstream in the inner channel 9, to reinforce it and give it an increase in velocity. The air intake 23 can either be formed as shown in FIGS. 28 and 29, or also as indicated in FIGS. 33 and 34, i.e. as a plurality of air intakes arranged along the outer edge of the mudguard, or as a common air intake 23a for individual channels 24c leading to outlets with different mutual location on the interior of the mudguard. To increase air speed, the outer channel can be provided with constrictions or other means increasing the ejector effect when the outer airstream is introduced into the channel 9 between the pressure zones. For successively mixing the airstreams in the outer and inner channels, the mudguard can be provided with louvres 23d to allow air passage between these channels, before both airstreams are combined in the main channel between the pressure zones. FIG. 31 shows an alternative embodiment of the outer channel, where the air intake 23c is placed on the rear side of the mudguard and the channel is given a curved shape, while its outlet is formed with a constriction increasing air speed and improving mixing between the airstreams. As is apparent from FIG. 32, the air speed can be increased by introducing a constricting orifice 25 in the outer channel 24.

The shape of the mudflap is also important for achieving the technical effect sought in accordance with the invention. As has been indicated in conjunction with the description of FIG. 6, a turbulent zone occurs behind a conventional mudflap 5, counteracting the damping effect of the main airstream directed towards the road surface and thus reducing the effectiveness of the assembly. In FIG. 28 the mudflap 5 has been given a flow-controlling configuration, thus causing the turbulence behind it to diminish while at the same time a guide channel is formed between the guide body 3 and the guiding surface of the mudflap, which redirects the flow vector KD so that it is introduced gently and substantially parallel to the airstream through the main channel 9 between the pressure zones. FIGS. 37–45 show different embodiments of splash protectors, comprising a part 5, 5a, 5b or 5c, intended to serve as mudflap and attached between two side portions 26, 26a, 26b and 26c, limiting the inner airstream generated by splash from the airflow to lessen the risk of the splash being sucked out to the sides of the vehicle. The splash protector also includes a guiding flange 27, 27a, 27b and 27c to guide the airstream in the main channel 9 between the pressure zones and prevent it from being disturbed by the merging airstream from the splash. The Figures also show how the mudflap can be shaped and brought to coact with the guide body 3 for obtaining the least possible turbulence in the area behind it. The "mudflap" can naturally be formed as a guide body, as indicated by dashed lines in FIG. 40 and full lines in FIG. 44.

FIGS. 35 and 36 show how a lamella or louvre type 5e of splash protector can be utilized in combination with an arrangement according to the invention. Louvre splash protectors are known per se, but have not achieved the desired effect since they only affect the heaviest particles in the splash, which after impinging on the louvres are thrown down onto the road surface in a spread-out condition. If an apparatus of the kind depicted in FIGS. 35 and 36 is utilized, however, splash spread from the louvres is prevented because the splash impinging on the louvres is reflected into the main airstream in the channel 9 between the pressure zones, where the side pieces 26e effectively coact to keep the main stream collected before it is allowed to flow out freely from the outlet 6a. The guide flange 27e is considerably extended in this embodiment and constitutes a part of a baffle in the channel between the pressure zones. FIG. 36 is a perspective view of how air and splash flow through a splash flow in a splash protector according to the lastmentioned embodiment.

FIGS. 46–49 show, among other things, how a splash protection assembly according to the present invention can be formed with movable side pieces 28 and 28a, pivotably mounted in the mudguard, e.g. about a shaft 29, and which can be retracted for removing the wheel or in conjunction with the bottom of the mudflap 5 knocking against an obstacle on the road surface. As previously indicated in the description, the airflow can cause water and dirt mist occurring between the wheel and the mudguard to be sucked out at the side past the edges of the mudguard and spread to the side of and behind the vehicle. The movable side pieces thus have the object of separating the airstream inside the mudguard from the airflow, thereby further reducing the risk of splash being spread out at the sides. As illustrated by FIG. 47, the movable side pieces are suitably formed as extensions 28 of the side portions of the mudguard 1, either on the outside or inside thereof. These extensions must naturally be movable, primarily to allow simple removal of the vehicle wheel in conjunction with wheel changes or other repairs to the vehicle. FIG. 48 shows an embodiment containing a plurality of the components described in conjunction with the previous description of the Figures. This splash protection assembly thus has a guide member in the form of a fixed guide body 3, as well as a movable guide body 8, for bringing into engagement with the vehicle wheel, and which is coupled via a transmission 32 to a fanwheel 31 intended to increase the flow speed through the channel between the guide body 3 and the baffle 4 immediately above it. The cylindrical guide body 8 can be brought to engage the vehicle wheel by means of a lever 33, pivotable in one direction under the action of a counterweight 34, there being a cable 35 connected to the lever for actuating it in the other direction. THe cable can in turn be actuated manually or by a motor. The splash protection assembly according to this embodiment further comprises two baffles 4 and an outer channel 24, the latter having an air intake 23 and an outlet shaped for venturi effect to increase the flow speed in the inner channel 9. The forward part of the mudguard can also be provided with an air intake 23, further contributing to increasing the flow speed between the wheel and the mudguard, thus also contributing to increasing the effectiveness of the assembly. The assembly is further provided with a movable side piece 28a, formed with a part constituting an extension of the baffle 1a and connecting thereto as well as to another part 27 which together with the mudflap 5f forms at least one extended portion 9a and 9b of the channel between both pressure zones. By means of this arrangement there is achieved an extremely concentrated airstream directed obliquely onto the road surface and containing the major portion of all the dust and splash generated as a result of the contact between the wheel and road surface. This concentrated airstream will not be affected to any notable degree by the turbulent air zone behind the vehicle which is situated substantially higher up behind the body of the vehicle. Even if there is a greater degree of turbulence, especially with large vehicles, the strong and concentrated airstream from the splash protection assembly overcomes the turbulence behind the vehicle and thereby the occurrence of splash wake is prevented from large vehicles also.

I claim:

1. A splash protection assembly for vehicles with mudguards, comprising means arranged between the wheel of the vehicle and the mudguard for lessening the spread of dust and splash as a result of the vehicle travel, said means including at least one guide member extending between said wheel and said mudguard substantially across the entire width of the mudguard and in the airstream occurring as a result of the rotation of the wheel and being provided with one guide surface to form at least a part of a channel for an airstream along the inside of the mudguard, wherein said guide member comprises a guide body with three guide surfaces, one of which is arranged to form said part of the channel, a second forming the lower side of the guide body and adapted to redirect a part of the airstream occurring as a result of the rotation of the wheel and the thus formed splash, and a third guide surface forming an edge of incidence together with the second guide surface, said edge of incidence being directed towards the airstream occurring as a result of the rotation of the wheel and the thus formed splash and splitting this airstream into two partial airstreams, one of which is guided by the second guide surface, and wherein the third guide surface together with the first guide surface form the upper side of the guide body and are adapted to redirect the second partial airstream so that the two partial airstreams enter the channel with directions which are substantially in parallel with one another and with the airstream in the channel.

2. An arrangement according to claim 1, characterized in that the inside of the mudguard is formed with side portions which together with the guide member define the channel (9) for the airstream along the inside of the mudguard.

3. An arrangement according to claim 2, characterized in that the side portions are extendable by means of movable side pieces (28) which are pivotably mounted in the mudguard.

4. An arrangement according to any of claims 1, 2 or 3, characterized in that at least two guide members (3, 4) are arranged between the mudguard and the wheel.

5. An arrangement according to claim 1, characterized in that the guide member (3) carries a splash protector (5).

6. An arrangement according to claim 5, characterized in that an extension portion for said mudguard (27) together with the splash protector (5f) forms an extended portion (a) of the channel (9) for the airstream along the inside of the mudguard.

7. An arrangement according to claim 6, characterized in that the extension portion (27) is connected to movable side pieces pivotally mounted in the mudguard (28).

8. An arrangement according to claim 5, characterized in that the splash protector (5) is carried a certain distance (7) spaced from the guide element (3) to allow passage of at least a part of the airstream passing over the third guide surface.

9. An arrangement according to claim 8, characterized in that the splash protector (5a–5c) is formed with guide means which, together with the guide elements (3) form at least one channel for the airstream passing over the third guide surface (3c).

10. An arrangement according to claim 8, characterized in that the splash protector (5f) is formed with lamellas for louvres, commonly forming substantially parallel channels intended for redirecting at least a part of the airstream generated by the rotation of the wheel and the thus formed splash, for interaction with the airstream in the channel (9a).

11. An arrangement according to claim 1, characterized in that the mudguard (1) is formed with an outer channel (24) at least partially located outside the mudguard and intended to enable an external speed airstream to be introduced on the inside of the mudguard for entraining by means of an ejector into the inner airstream along the inside of the mudguard, said outer channel being provided with at least one constriction for increasing the air speed.

12. An arrangement according to claim 11, characterized in that the mudguard is provided with louvres as said injector for allowing air passage between the outer and inner channels.

13. A splash protection assembly for vehicles with mudguards, comprising means arranged between the wheel of the vehicle and the mudguard for lessening the spread of dust and splash as a result of the vehicle travel, said means including at least one guide member extending between said wheel and said mudguard substantially across the entire width of the mudguard and in the airstream occurring as a result of the rotation of the wheel, said at least one guide member being provided with a guide surface forming at least a part of a channel for an airstream along the inside of the mudguard, wherein said guide member comprises a substantially circular guide body which is rotatably disposed for bringing into engagement against the wheel of said vehicle, said guide body splitting said airstream occurring as a result of the rotation of said wheel into two partial airstreams which are guided by said guide body to redirect said two partial airstreams so that said two partial airstreams enter the channel with directions which are substantially in parallel with one another and with the airstream in the channel.

14. An arrangement according to claim 13, characterized in that the cylindrical guide body (8) is connected to at least one guide baffle (19).

15. An arrangement according to claim 13, characterized in that the cylindrical body (8) is connected to a fan wheel (31) intended to increase the air speed in the channel.

* * * * *

UNITED STATES PATENT AND TRADEMARK OFFICE
CERTIFICATE OF CORRECTION

PATENT NO. : 4,334,694

DATED : June 15, 1982

INVENTOR(S) : ANDRZEJ T. IWANICKI

It is certified that error appears in the above—identified patent and that said Letters Patent is hereby corrected as shown below:

Please correct the following:

[30] -- Foreign Application Priority Data

July 11, 1977  [SE] Sweden......7708063 --

Signed and Sealed this

Twenty-first Day of September 1982

[SEAL]

Attest:

GERALD J. MOSSINGHOFF

Attesting Officer     Commissioner of Patents and Trademarks